United States Patent
Jung et al.

(10) Patent No.: US 10,483,341 B2
(45) Date of Patent: Nov. 19, 2019

(54) DISPLAY DEVICE

(71) Applicant: Samsung Display Co., Ltd., Yongin-si, Gyeonggi-do (KR)

(72) Inventors: Kwang Chul Jung, Yongin-si (KR); Hyun Joon Kim, Yongin-si (KR); Sung Yoon Kim, Yongin-si (KR); Hyun Suk Yang, Yongin-si (KR); Doo Youl Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/974,530

(22) Filed: May 8, 2018

(65) Prior Publication Data

US 2019/0096978 A1 Mar. 28, 2019

(30) Foreign Application Priority Data

Sep. 28, 2017 (KR) .................. 10-2017-0126275

(51) Int. Cl.
| | |
|---|---|
| G09G 5/02 | (2006.01) |
| H01L 27/32 | (2006.01) |
| G09G 3/3233 | (2016.01) |
| G09G 3/3275 | (2016.01) |
| G09G 3/3266 | (2016.01) |
| G09G 3/20 | (2006.01) |

(52) U.S. Cl.
CPC .......... *H01L 27/3276* (2013.01); *G09G 3/20* (2013.01); *G09G 3/3233* (2013.01); *G09G 3/3266* (2013.01); *G09G 3/3275* (2013.01)

(58) Field of Classification Search
CPC .. G09G 3/3233; G09G 3/3258; G09G 3/3266; G09G 3/3276; H01L 27/124; H01L 27/3246; H01L 27/326; H01L 27/3265; H01L 27/3276
See application file for complete search history.

(56) References Cited

U.S. PATENT DOCUMENTS

| | | | | |
|---|---|---|---|---|
| 5,270,693 A | * | 12/1993 | Wyler | .................. G04G 9/0035 345/206 |
| 9,313,478 B2 | * | 4/2016 | Hsieh | ................ G02F 1/136286 |
| 9,626,900 B2 | * | 4/2017 | Anzai | ................... G09G 3/3225 |

(Continued)

FOREIGN PATENT DOCUMENTS

| | | |
|---|---|---|
| KR | 10-2013-0136806 A | 12/2013 |
| KR | 10-2016-0005859 A | 1/2016 |

(Continued)

*Primary Examiner* — Joe H Cheng
(74) *Attorney, Agent, or Firm* — Lewis Roca Rothgerber Christie LLP

(57) ABSTRACT

A display device includes first pixels in a first pixel area and coupled with first scan lines, first scan stage circuits in a first peripheral area outside the first pixel area, and configured to supply a first scan signal to the first scan lines, second pixels in a second pixel area having a width that is less than a width of the first pixel area, and coupled with second scan lines, second scan stage circuits in a second peripheral area outside the second pixel area, and configured to generate a second scan signal, and first load matching units respectively between the second scan stage circuits, and configured to delay the second scan signal, and to supply the delayed second scan signal to the second scan lines.

16 Claims, 9 Drawing Sheets

(56) References Cited

U.S. PATENT DOCUMENTS

| | | | |
|---|---|---|---|
| 9,646,541 B2 | 5/2017 | Kim | |
| 2006/0077191 A1* | 4/2006 | Ming-Daw | G02F 1/133351 |
| | | | 345/204 |
| 2008/0018557 A1* | 1/2008 | Maeda | G02F 1/167 |
| | | | 345/55 |
| 2009/0189835 A1* | 7/2009 | Kim | G09G 3/3677 |
| | | | 345/80 |
| 2010/0157189 A1* | 6/2010 | Ma | G02F 1/136286 |
| | | | 349/48 |
| 2016/0189664 A1 | 6/2016 | Lee et al. | |
| 2017/0116923 A1 | 4/2017 | Bae et al. | |
| 2017/0249896 A1* | 8/2017 | Kim | G09G 3/3225 |
| 2017/0301280 A1* | 10/2017 | Ka | G09G 3/2092 |
| 2017/0337876 A1* | 11/2017 | Kim | G09G 3/3225 |
| 2017/0352328 A1* | 12/2017 | Jeong | G09G 3/3266 |
| 2018/0005585 A1* | 1/2018 | Kim | G09G 3/3258 |
| 2018/0090061 A1* | 3/2018 | Kim | G09G 3/3233 |
| 2018/0151660 A1* | 5/2018 | Kim | H01L 27/3223 |
| 2018/0342572 A1 | 11/2018 | Park et al. | |

FOREIGN PATENT DOCUMENTS

| | | |
|---|---|---|
| KR | 10-2016-0082207 A | 7/2016 |
| KR | 10-2017-0047442 A | 5/2017 |
| KR | 10-2018-0003747 A | 1/2018 |
| KR | 10-2018-0128555 | 12/2018 |

\* cited by examiner

DISPLAY DEVICE

CROSS-REFERENCE TO RELATED APPLICATION

This application claims priority to, and the benefit of, Korean patent application number 10-2017-0126275 filed on Sep. 28, 2017, the entire disclosure of which is incorporated herein in its entirety by reference.

BACKGROUND

1. Field

Various embodiments of the present disclosure relates to a display device.

2. Description of Related Art

With the development of information technology, the importance of a display device that is a connection medium between a user and information has been emphasized. Recently, liquid crystal display devices, organic light emitting display devices, and so forth are widely used.

Such display devices include a plurality of pixels and drivers for driving the pixels. Lines, along with a plurality of transistors coupled to the lines to drive a display element, are formed on each pixel. The lines may have different load values depending on the lengths thereof. Due to a difference in load value, an image to be displayed may have uneven luminance.

SUMMARY

Various embodiments of the present disclosure are directed to a display device capable of displaying an image having uniform luminance.

Various embodiments of the present disclosure are directed to a display device having a structure capable of efficiently using dead space.

An embodiment of the present disclosure may provide a display device including first pixels in a first pixel area and coupled with first scan lines, first scan stage circuits in a first peripheral area outside the first pixel area, and configured to supply a first scan signal to the first scan lines, second pixels in a second pixel area having a width that is less than a width of the first pixel area, and coupled with second scan lines, second scan stage circuits in a second peripheral area outside the second pixel area, and configured to generate a second scan signal, and first load matching units respectively between the second scan stage circuits, and configured to delay the second scan signal, and to supply the delayed second scan signal to the second scan lines.

At least a corner of the second pixel area may have a curved shape.

A number of second pixels on each horizontal line may be reduced in a direction away from the first pixel area.

Each of the first load matching units may include a first delay pattern, and a second delay pattern on a layer different from a layer on which the first delay pattern is located, with an insulating layer provided therebetween.

The first delay pattern may include an input terminal coupled to an output terminal of a corresponding one of the second scan stage circuits, and an output terminal electrically coupled to a corresponding one of the second scan lines.

The first delay pattern and the second delay pattern may form a delay capacitor.

The first load matching units may delay the second scan signal by a time constant corresponding to the first delay pattern and the second delay pattern.

The time constant may be increased as a distance between the first peripheral area and a corresponding one of the first load matching unit is increased.

A distance between the second scan stage circuits may be greater than a distance between the first scan stage circuits.

The display device may further include third pixels in a third pixel area spaced apart from the second pixel area, and coupled with third scan lines, third scan stage circuits in a third peripheral area provided outside the third pixel area, and configured to generate a third scan signal, and second load matching units respectively between the third scan stage circuits, and configured to delay the third scan signal, and to supply the delayed third scan signal to the third scan lines.

The third pixel area may have a width that is less than the width of the first pixel area, and a number of third pixels on each horizontal line may be reduced in a direction away from the first pixel area.

A distance between the third scan stage circuits may be greater than the distance between the first scan stage circuits.

Each of the second load matching units may include a first delay pattern, and a second delay pattern on a layer different from a layer on which the first delay pattern is located, the second delay pattern being configured to form a capacitance with the first delay pattern.

The second load matching units may delay the third scan signal by a time constant corresponding to the first delay pattern and the second delay pattern.

The time constant may be increased as a distance between the first peripheral area and a corresponding one of the second load matching units is increased.

The display device may further include a first antistatic circuit coupled with the first scan lines, and a second antistatic circuit coupled with the second scan lines.

DETAILED DESCRIPTION

Figure 1:
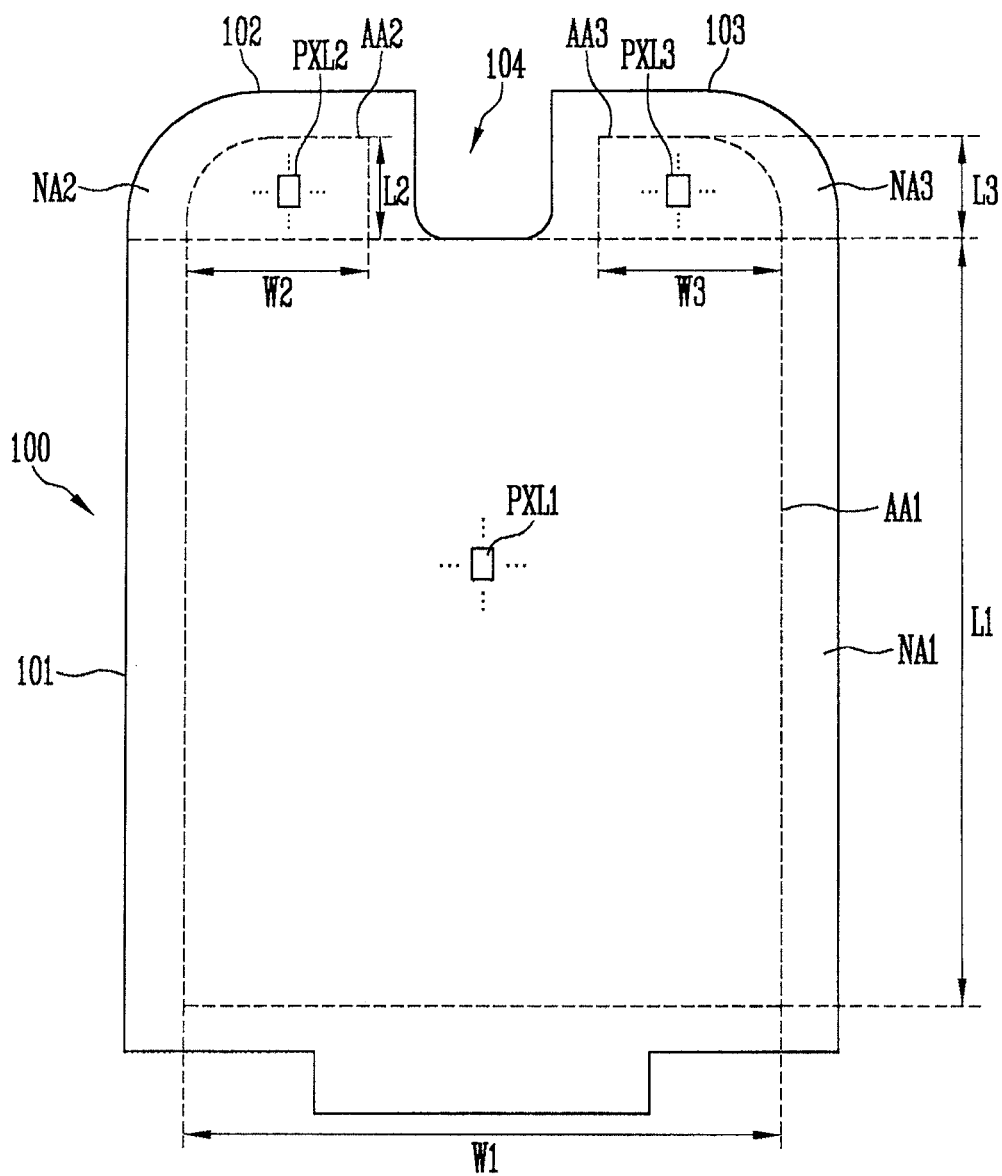
FIG. 1 is a diagram illustrating pixel areas of a display device in accordance with an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a diagram illustrating pixel areas AA1, AA2, and AA3 of a display device 10 in accordance with an embodiment of the present disclosure.

Referring to FIG. 1, the display device 10 in accordance with the present embodiment may include the pixel areas AA1, AA2, and AA3, peripheral areas NA1, NA2, and NA3, and pixels PXL1, PXL2, and PXL3.

The pixels PXL1, PXL2, and PXL3 may be located in the pixel areas AA1, AA2, and AA3, so that an image may be displayed on each of the pixel areas AA1, AA2, and AA3. Hence, each of the pixel areas AA1, AA2, and AA3 may refer to a display area.

Components (e.g., drivers and lines) for driving the pixels PXL1, PXL2, and PXL3 may be located in the peripheral areas NA1, NA2, and NA3. Each of the peripheral areas NA1, NA2, and NA3 may refer to a non-display area, as there are no pixels located therein.

For example, the peripheral areas NA1, NA2, and NA3 may be formed outside the pixel areas AA1, AA2, and AA3, and may have a shape to enclose at least portions of the pixel areas AA1, AA2, and AA3.

The pixel areas AA1, AA2, and AA3 may include a first pixel area AA1, a second pixel area AA2, and a third pixel area AA3.

The second pixel area AA2 and the third pixel area AA3 may be located on one side of the first pixel area AA1. The second pixel area AA2 and the third pixel area AA3 may be spaced apart from each other.

The first pixel area AA1 may have a surface area that is greater than that of the second pixel area AA2 or the third pixel area AA3.

For example, a width W1 of the first pixel area AA1 may be greater than the widths W2 and W3 of the other pixel areas AA2 and AA3. A length L1 of the first pixel area AA1 may be greater than the lengths L2 and L3 of the other pixel areas AA2 and AA3.

Furthermore, each of the second and third pixel areas AA2 and AA3 may have a surface area that is less than that of the first pixel area AA1, and the second and third pixel areas AA2 and AA3 may either have the same surface area as each other or have different surface areas.

For example, the width W2 of the second pixel area AA2 may be equal to, or different from, the width W3 of the third pixel area AA3. The length L2 of the second pixel area AA2 may be equal to, or different from, the length L3 of the third pixel area AA3.

The peripheral areas NA1, NA2, and NA3 may include a first peripheral area NA1, a second peripheral area NA2, and a third peripheral area NA3.

The first peripheral area NA1 may be located around the first pixel area AA1, and may have a shape to enclose at least a portion of the first pixel area AA1.

The first peripheral area NA1 may generally have a constant width. However, the present disclosure is not limited to this. For example, the width of the first peripheral area NA1 may be changed depending on a position on the display device 10.

The second peripheral area NA2 may be located around the second pixel area AA2, and may have a shape to enclose at least a portion of the second pixel area AA2.

The second peripheral area NA2 may generally have a constant width. The present disclosure is not limited to this. For example, the width of the second peripheral area NA2 may be changed depending on a position on the display device 10.

The third peripheral area NA3 may be located outside the third pixel area AA3, and may have a shape to enclose at least a portion of the third pixel area AA3.

The third peripheral area NA3 may generally have a constant width. The present disclosure is not limited to this. For example, the width of the third peripheral area NA3 may be changed depending on a position on the display device 10.

The second peripheral area NA2 and the third peripheral area NA3 may or may not be coupled to each other, depending on the shape of the substrate 100.

The peripheral areas NA1, NA2, and NA3 may generally have the same width. The present disclosure is not limited to this. For example, the widths of the peripheral areas NA1, NA2, and NA3 may be changed depending on positions on the display device 10.

The pixels PXL1, PXL2, and PXL3 may include first pixels PXL1, second pixels PXL2, and third pixels PXL3.

For example, the first pixels PXL1 may be located in the first pixel area AA1, the second pixels PXL2 may be located in the second pixel area AA2, and the third pixels PXL3 may be located in the third pixel area AA3.

The pixels PXL1, PXL2, and PXL3 may emit light at a given luminance under control of drivers located in the peripheral areas NA1, NA2, and NA3. For this operation, each of the pixels PXL1, PXL2, and PXL3 may include a light-emitting element (e.g., an organic light-emitting diode).

The pixel areas AA1, AA2, and AA3 and the peripheral areas NA1, NA2, and NA3 may be defined on the substrate 100 of the display device 10.

The substrate 100 may be made of insulating material such as glass or resin. Furthermore, the substrate 100 may be made of material having flexibility so as to be bendable or foldable, and may have a single layer or a multilayer structure.

For example, the substrate 100 may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material constituting the substrate 100 may be changed in various ways, and the substrate 100 may also be made of fiberglass-reinforced plastic (FRP) or the like.

The substrate 100 may be formed in various shapes so long as the pixel areas AA1, AA2, and AA3 and the peripheral areas NA1, NA2, and NA3 can be defined on the substrate 100.

For instance, the substrate 100 may include a planar base substrate 101, and first auxiliary plate 102 and a second auxiliary plate 103 that protrude from an end of the base substrate 101.

The first auxiliary plate 102 and the second auxiliary plate 103 may be integrally formed with the base substrate 101. A recess, or a notch, 104 may be present between the first auxiliary plate 102 and the second auxiliary plate 103.

The recess 104 may be an area formed by removing a portion of the substrate 100. The first auxiliary plate 102 and the second auxiliary plate 103 may be spaced apart from each other by the recess 104.

Each of the first auxiliary plate 102 and the second auxiliary plate 103 may have a surface area that is less than that of the base substrate 101. The first auxiliary plate 102 and the second auxiliary plate 103 may have the same surface area as each other, or may have different surface areas.

The first auxiliary plate 102 and the second auxiliary plate 103 may have various shapes so long as the pixel areas AA2 and AA3 and the peripheral areas NA2 and NA3 can be defined.

The first pixel area AA1 and the first peripheral area NA1 may be defined on the base substrate 101. The second pixel area AA2 and the second peripheral area NA2 may be defined on the first auxiliary plate 102. The third pixel area AA3 and the third peripheral area NA3 may be defined on the second auxiliary plate 103.

The base substrate 101 may have various shapes. For example, the base substrate 101 may have a shape such as a polygonal shape or a circular shape. Furthermore, at least a portion of the base substrate 101 may have a curved shape.

For example the base substrate 101 may have a generally rectangular shape. Alternatively, a corner of the base substrate 101 may have an inclined shape or a curved shape.

Although the base substrate 101 may have a shape equal to or similar to that of the first pixel area AA1, it is not limited thereto, and may have a shape different from that of the first pixel area AA1.

The first auxiliary plate 102 and the second auxiliary plate 103 may also have various shapes.

For example, each of the first auxiliary plate 102 and the second auxiliary plate 103 may have a polygonal shape or a circular shape. Furthermore, at least a portion of each of the first auxiliary plate 102 and the second auxiliary plate 103 may have a curved shape.

The recess 104 may have various shapes. For examples, the recess 104 may have a shape such as a polygonal shape or a circular shape. Furthermore, at least a portion of the recess 104 may have a curved shape.

The first to third pixel areas AA1 to AA3 may have various shapes. Each of the first to third pixel areas AA1 to AA3 may have a polygonal shape or a circular shape.

In FIG. 1, there is illustrated an example in which the first pixel area AA1 has a rectangular shape. The present disclosure is not limited to this. For example, at least a portion of the first pixel area AA1 may have a curved shape. For example, a corner of the first pixel area AA1 may have a curved shape having a curvature.

In FIG. 1, there is illustrated an example in which at least a portion of each of the second and third pixel areas AA2 and AA3 has a curved shape. The present disclosure is not limited to this, and each of the second and third pixel areas AA2 and AA3 may have a rectangular shape.

In this case, the second peripheral area NA2 may have on at least a portion thereof a curved shape corresponding to the second pixel area AA2.

In response to a change in shape of the second pixel area AA2, the number of second pixels PXL2 located on each line (row or column) may be changed depending on the position thereof.

Also, the third peripheral area NA3 may have on at least a portion thereof a curved shape corresponding to the third pixel area AA3.

In response to a change in shape of the third pixel area AA3, the number of third pixels PXL3 located on each line (row or column) may be changed depending on the position thereof.

Figure 2:
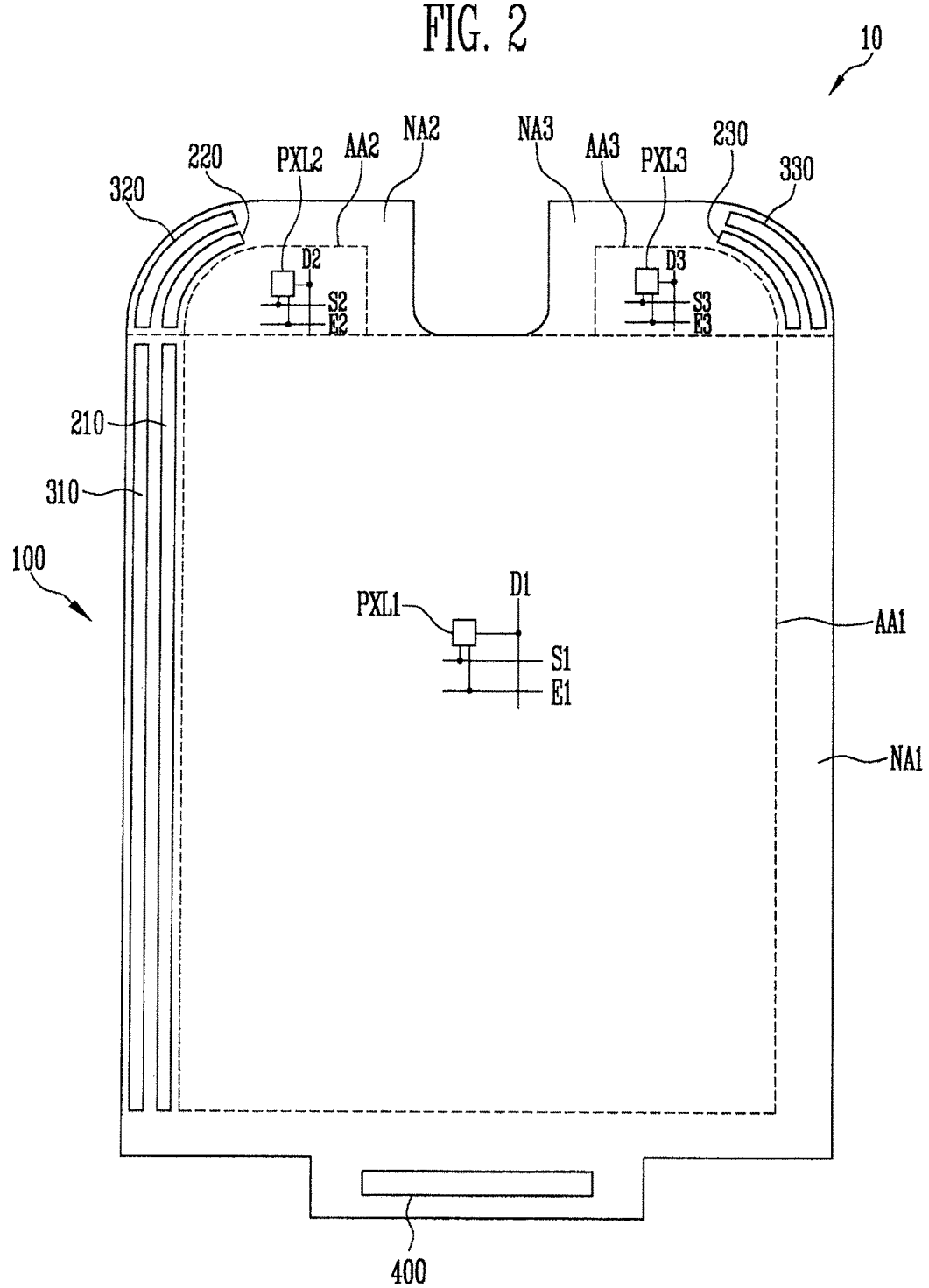
FIG. 2 is a diagram illustrating a display device in accordance with an embodiment of the present disclosure.

FIG. 2 is a diagram illustrating a display device 10 in accordance with an embodiment of the present disclosure.

Referring to FIG. 2, the display device 10 in accordance with the present embodiment may include a substrate 100, first pixels PXL1, second pixels PXL2, third pixels PXL3, a first scan driver 210, a second scan driver 220, a third scan driver 230, a first emission driver 310, a second emission driver 320, and a third emission driver 330.

The first pixels PXL1 may be located in the first pixel area AA1, and each may be coupled to a first scan line S1, a first emission control line E1, and a first data line D1.

The first scan driver 210 may supply first scan signals to the first pixels PXL1 through the first scan lines S1.

For example, the first scan driver 210 may sequentially supply first scan signals to the first scan lines S1.

The first scan driver 210 may be located in the first peripheral area NA1.

For example, the first scan driver 210 may be located in the first peripheral area NA1 that is present on one side (e.g., a left side in FIG. 2) of the first pixel area AA1.

First scan routing lines may be coupled between the first scan driver 210 and the first scan lines S1.

The first scan driver 210 may be electrically coupled with the first scan lines S1 located in the first pixel area AA1 through the first scan routing lines.

The first emission driver 310 may supply first emission control signals to the first pixels PXL1 through the first emission control lines E1.

For example, the first emission driver 310 may sequentially supply first emission control signals to the first emission control lines E1.

The first emission driver 310 may be located in the first peripheral area NA1.

For example, the first emission driver 310 may be located in the first peripheral area NA1 that is present on one side (e.g., the left side in FIG. 2) of the first pixel area AA1.

In FIG. 2, there is illustrated an example in which the first emission driver 310 is located on an outer side of the first scan driver 210, but in other embodiments, the first emission driver 310 may be located on an inner side of the first scan driver 210.

First emission routing lines may be coupled between the first emission driver 310 and the first emission control lines E1.

The first emission driver 310 may be electrically coupled with the first emission control lines E1 located in the first pixel area AA1 through the first emission routing lines.

On the other hand, in the case where there is no need for the first pixels PXL1 to use the first emission control signals, the first emission driver 310, the first emission routing lines, and the first emission control lines E1 may be omitted.

In FIG. 1, there is illustrated an example in which the first scan driver 210 and the first emission driver 310 are located on the left side of the first pixel area AA1, but the present disclosure is not limited thereto. For example, the first scan driver 210 and the first emission driver 310 may be located on the right side of the first pixel area AA1, or may be located on either or both of the left and right sides of the first pixel area AA1.

The second pixels PXL2 may be located in the second pixel area AA2 and each may be coupled to a second scan line S2, a second emission control line E2, and a second data line D2.

The second scan driver 220 may supply second scan signals to the second pixels PXL2 through the second scan lines S2.

For example, the second scan driver 220 may sequentially supply second scan signals to the second scan lines S2.

The second scan driver 220 may be located in the second peripheral area NA2.

For example, the second scan driver 220 may be located in the second peripheral area NA2 that is present on one side (e.g., a left side in FIG. 2) of the second pixel area AA2.

Second scan routing lines may be coupled between the second scan driver 220 and the second scan lines S2.

Thereby, the second scan driver 220 may be electrically coupled with the second scan lines S2 located in the second pixel area AA2 through the second scan routing lines.

The second emission driver 320 may supply second emission control signals to the second pixels PXL2 through the second emission control lines E2.

For example, the second emission driver 320 may sequentially supply second emission control signals to the second emission control lines E2.

The second emission driver 320 may be located in the second peripheral area NA2.

For example, the second emission driver 320 may be located in the second peripheral area NA2 that is present on one side (e.g., the left side in FIG. 2) of the second pixel area AA2.

In FIG. 2, there is illustrated an example in which the second emission driver 320 is located on an outer side of the second scan driver 220. However, in other embodiments, the second emission driver 320 may be located on an inner side of the second scan driver 220.

Second emission routing lines may be coupled between the second emission driver 320 and the second emission control lines E2.

The second emission driver 320 may be electrically coupled with the second emission control lines E2 located in the second pixel area AA2 through the second emission routing lines.

On the other hand, in the case where there is no need for the second pixels PXL2 to use the second emission control signals, the second emission driver 320, the second emission routing lines, and the second emission control lines E2 may be omitted.

Because the surface area of the second pixel area AA2 is less than that of the first pixel area AA1, the lengths of the second scan line S2 and the second emission control line E2 may be respectively less than those of the first scan line S1 and the first emission control line E1.

Furthermore, the number of second pixels PXL2 coupled to each second scan line S2 may be less than the number of first pixels PXL1 coupled to each first scan line S1. The number of second pixels PXL2 coupled to each second emission control line E2 may be less than the number of first pixels PXL1 coupled to each first emission control line E1.

The third pixels PXL3 may be located in the third pixel area AA3 and each may be coupled to a third scan line S3, a third emission control line E3, and a third data line D3.

The third scan driver 230 may supply third scan signals to the third pixels PXL3 through the third scan lines S3.

For example, the third scan driver 230 may sequentially supply third scan signals to the third scan lines S3.

The third scan driver 230 may be located in the third peripheral area NA3.

For example, the third scan driver 230 may be located in the third peripheral area NA3 that is present on one side (e.g., a right side in FIG. 2) of the third pixel area AA3.

Third scan routing lines may be coupled between the third scan driver 230 and the third scan lines S3.

Thereby, the third scan driver 230 may be electrically coupled with the third scan lines S3 located in the third pixel area AA3 through the third scan routing lines.

The third emission driver 330 may supply third emission control signals to the third pixels PXL3 through the third emission control lines E3.

For example, the third emission driver 330 may sequentially supply third emission control signals to the third emission control lines E3.

The third emission driver 330 may be located in the third peripheral area NA3.

For example, the third emission driver 330 may be located in the third peripheral area NA3 that is present on one side (e.g., the right side in FIG. 2) of the third pixel area AA3.

In FIG. 2, there is illustrated an example in which the third emission driver 330 is located on an outer side of the third scan driver 230. However, in other embodiments, the third emission driver 330 may be located on an inner side of the third scan driver 230.

Third emission routing lines may be coupled between the third emission driver 330 and the third emission control lines E3.

Thereby, the third emission driver 330 may be electrically coupled with the third emission control lines E3 located in the third pixel area AA3 through the third emission routing lines.

On the other hand, in the case where there is no need for the third pixels PXL3 to use the third emission control signals, the third emission driver 330, the third emission routing lines, and the third emission control lines E3 may be omitted.

Because the surface area of the third pixel area AA3 is less than that of the first pixel area AA1, the lengths of the third scan line S3 and the third emission control line E3 may be respectively less than those of the first scan line S1 and the first emission control line E1.

Furthermore, the number of third pixels PXL3 coupled to each third scan line S3 may be less than the number of first pixels PXL1 coupled to each first scan line S1. The number of third pixels PXL3 coupled to each third emission control line E3 may be less than the number of first pixels PXL1 coupled to each first emission control line E1.

The emission control signal is used to control the time during which the pixels PXL1, PXL2, or PXL3 emit light.

In an embodiment, the emission control signal may be set to have a width that is greater than that of the scan signal.

For example, the emission control signal may be set to a gate-off voltage (e.g., a high-level voltage) so that the transistors included in the pixels PXL1, PXL2, or PXL3 may be turned off. The scan signal may be set to a gate-on voltage (e.g., a low-level voltage) so that the transistors included in the pixels PXL1, PXL2, or PXL3 may be turned on.

The data driver 400 may supply data signals to the pixels PXL1, PXL2, and PXL3 through the data lines D1, D2, and D3. For example, the second data lines D2 may be coupled to some of the first data lines D1, and the third data lines D3 may be coupled to other some of the first data lines D1.

The data driver 400 may be located in the first peripheral area NA1, and may be present at a position at which the data driver 400 does not overlap the first scan driver 210. For instance, the data driver 400 may be located in the portion of the first peripheral area NA1 that is present on a lower side of the first pixel area AA1.

The data driver 400 may be installed by any one of various methods, such as a chip on glass method, a chip on plastic method, a tape carrier package method, and a chip on film method.

For example, the data driver 400 may be directly mounted on the substrate 100, or may be coupled to the substrate 100 by a separate component (e.g., a flexible printed circuit board).

In other embodiments, the display device 10 may further include a timing controller configured to provide control signals to the scan drivers 210, 220, and 230, the emission drivers 310, 320, and 330, and the data driver 400.

Figure 3:
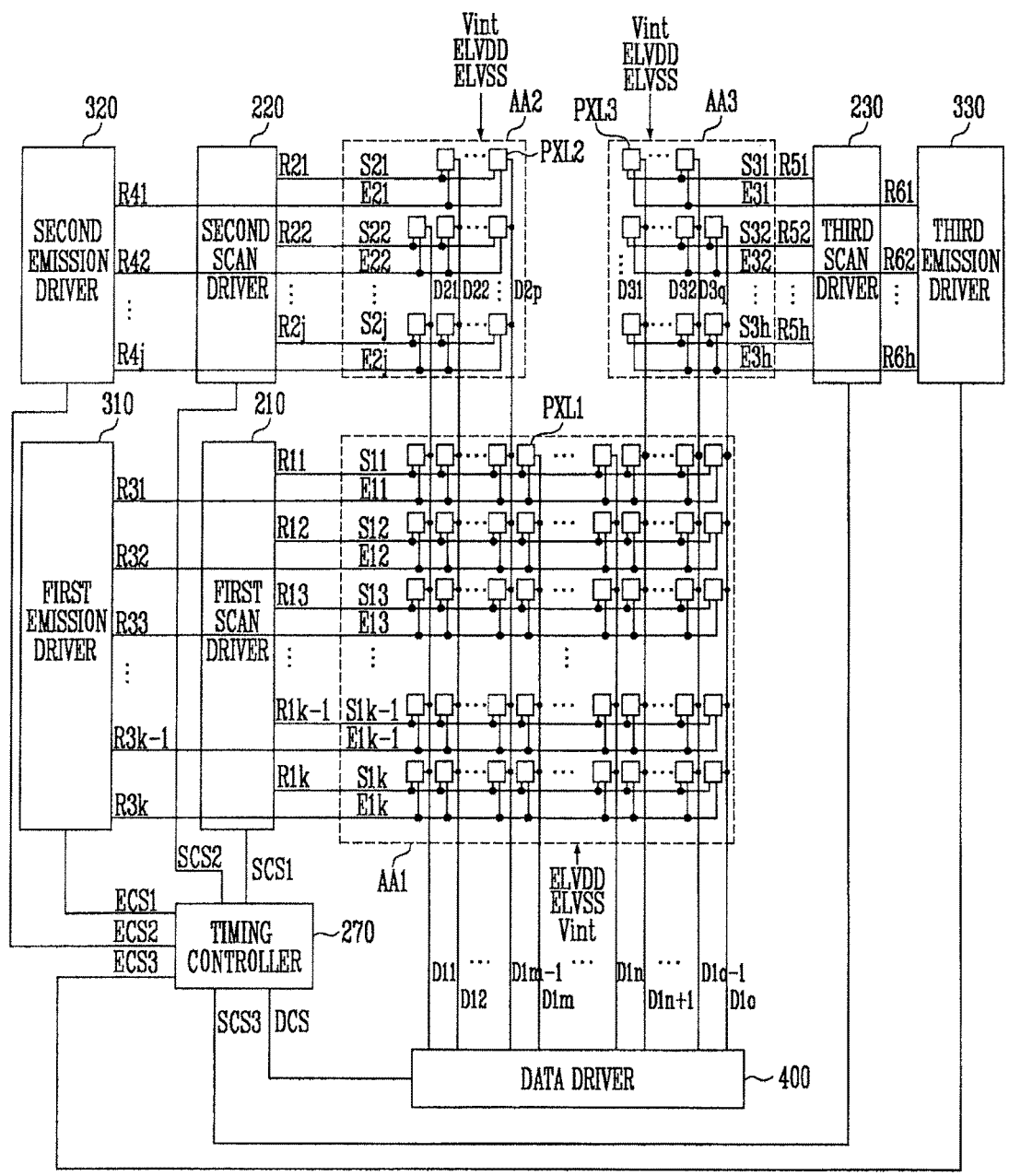
FIG. 3 is a diagram illustrating in detail the configuration of the display device in accordance with an embodiment of the present disclosure.

FIG. 3 is a diagram illustrating in detail the configuration of the display device 10 in accordance with an embodiment of the present disclosure.

The first scan driver 210 may supply first scan signals to the first pixels PXL1 through first scan routing lines R11 to R1$k$ and the first scan lines S11 to S1$k$.

The first scan routing lines R11 to R1$k$ may be coupled between an output terminal of the first scan driver 210 and the first scan lines S11 to S1$k$.

For example, the first scan routing lines R11 to R1$k$ and the first scan lines S11 to S1$k$ may be located on different layers, and in this case, may be coupled to each other through contact holes.

Alternatively, the first scan routing lines R11 to R1$k$ and the first scan lines S11 to S1$k$ may be integrally formed on the same layer. In other words, the first scan routing lines R11 to R1$k$ may be portions of the first scan lines S11 to S1$k$.

The first emission driver 310 may supply first emission control signals to the first pixels PXL1 through first emission routing lines R31 to R3$k$ and the first emission control lines E11 to E1$k$.

The first emission routing lines R31 to R3$k$ may be coupled between an output terminal of the first emission driver 310 and the first emission control lines E11 to E1$k$.

For example, the first emission routing lines R31 to R3$k$ and the first emission control lines E11 to E1$k$ may be located on different layers, and in this case, may be coupled to each other through contact holes.

Alternatively, the first emission routing lines R31 to R3$k$ and the first emission control lines E11 to E1$k$ may be integrally formed on the same layer. In other words, the first emission routing lines R31 to R3$k$ may be portions of the first emission control lines E11 to E1$k$.

The first scan driver 210 and the first emission driver 310 may be respectively operated in response to a first scan control signal SCS1 and a first emission control signal ECS1.

The data driver 400 may supply data signals to the first pixels PXL1 through first data lines D11 to D1$o$.

The first pixels PXL1 may be coupled to a first pixel power source ELVDD and a second pixel power source ELVSS. When suitable, the first pixels PXL1 may be additionally coupled to an initialization power source Vint.

The first pixels PXL1 may be supplied with data signals from the first data lines D11 to D1$o$ when the first scan signals are supplied to the first scan lines S11 to S1$k$. Each of the first pixels PXL1 that have been supplied with the data signals may control the amount of current flowing to the second pixel power source ELVSS via an organic light-emitting diode.

The second scan driver 220 may supply second scan signals to the second pixels PXL2 through the second scan routing lines R21 to R2$j$ and the second scan lines S21 to S2$j$.

The second scan routing lines R21 to R2$j$ may be coupled between an output terminal of the second scan driver 220 and the second scan lines S21 to S2$j$.

For example, the second scan routing lines R21 to R2$j$ and the second scan lines S11 to S2$j$ may be located on different layers, and in this case, may be coupled to each other through contact holes.

Alternatively, the second scan routing lines R21 to R2$j$ and the second scan lines S21 to S2$j$ may be integrally formed on the same layer. In this case, the second scan routing lines R21 to R2$j$ may be portions of the second scan lines S21 to S2$j$.

The second emission driver 320 may supply second emission control signals to the second pixels PXL2 through second emission routing lines R41 to R4$j$ and the second emission control lines E21 to E2$j$.

The second emission routing lines R41 to R4$j$ may be coupled between an output terminal of the second emission driver 320 and the second emission control lines E21 to E2$j$.

For example, the second emission routing lines R41 to R4$j$ and the second emission control lines E21 to E2$j$ may be located on different layers, and in this case, may be coupled to each other through contact holes.

Alternatively, the second emission routing lines R41 to R4$j$ and the second emission control lines E21 to E2$j$ may be located on the same layer. In this case, the second emission routing lines R41 to R4$j$ may be portions of the second emission control lines E21 to E2$j$.

The second scan driver 220 and the second emission driver 320 may be respectively operated in response to a second scan control signal SCS2 and a second emission control signal ECS2.

The data driver 400 may supply data signals to the second pixels PXL2 through second data lines D21 to D2$p$.

For example, the second data lines D21 to D2$p$ may be coupled with some first data lines D11 to D1$m-1$.

The second pixels PXL2 may be coupled to the first pixel power source ELVDD and the second pixel power source ELVSS. When suitable, the second pixels PXL2 may be additionally coupled to the initialization power source Vint.

The second pixels PXL2 may be supplied with data signals from the second data lines D21 to D2$p$ when the second scan signals are supplied to the second scan lines S21 to S2$j$. Each of the second pixels PXL2 that have been supplied with the data signals may control the amount of current flowing to the second pixel power source ELVSS via an organic light-emitting diode.

Furthermore, the number of second pixels PXL2 located on each line (row or column) may be changed depending on the position thereof.

Because the surface area of the second pixel area AA2 is less than that of the first pixel area AA1, the number of second pixels PXL2 may be less than the number of first pixels PXL1. The lengths and numbers of second scan lines S21 to S2$j$ and second emission control lines E21 to E2$j$ may be respectively less than those of the first scan lines S11 to S1$k$ and the first emission control lines E11 to E1$k$.

The number of second pixels PXL2 coupled to any one of the second scan lines S21 to S2$j$ may be less than the number of first pixels PXL1 coupled to any one of the first scan lines S11 to S1$k$.

The number of second pixels PXL2 coupled to any one of the second emission control lines E21 to E2$j$ may be less than the number of first pixels PXL1 coupled to any one of the first emission control lines E11 to E1$k$.

The third scan driver 230 may supply third scan signals to the third pixels PXL3 through third scan routing lines R51 to R5$h$ and the third scan lines S31 to S3$h$.

The third scan routing lines R51 to R5$h$ may be coupled between an output terminal of the third scan driver 230 and the third scan lines S31 to S3$h$.

For example, the third scan routing lines R51 to R5$h$ and the third scan lines S31 to S3$h$ may be located on different layers, and in this case, may be coupled to each other through contact holes.

Alternatively, the third scan routing lines R51 to R5$h$ and the third scan lines S31 to S3$h$ may be integrally formed on the same layer. In this case, the third scan routing lines R51 to R5$h$ may be portions of the third scan lines S31 to S3$h$.

The third scan driver 230 may be operated in response to a third scan control signal SCS3.

The third emission driver 330 may supply third emission control signals to the third pixels PXL3 through third emission routing lines R61 to R6$h$ and the third emission control lines E31 to E3$h$.

The third emission routing lines R61 to R6$h$ may be coupled between an output terminal of the third emission driver 330 and the third emission control lines E31 to E3$h$.

For example, the third emission routing lines R61 to R6$h$ and the third emission control lines E31 to E3$h$ may be located on different layers, and in this case, may be coupled to each other through contact holes.

Alternatively, the third emission routing lines R61 to R6$h$ and the third emission control lines E31 to E3$h$ may be integrally formed on the same layer. In this case, the third emission routing lines R61 to R6$h$ may be portions of the third emission control lines E31 to E3$h$.

The third emission driver 330 may be operated in response to a third emission control signal ECS3.

The data driver 400 may supply data signals to the third pixels PXL3 through third data lines D31 to D3$q$.

The third data lines D31 to D3$q$ may be coupled to some first data lines D1$n$+1 to D1$o$.

The third pixels PXL3 may be coupled to the first pixel power source ELVDD and the second pixel power source ELVSS. When suitable, the third pixels PXL3 may be additionally coupled to the initialization power source Vint.

The third pixels PXL3 may be supplied with data signals from the third data lines D31 to D3$q$ when the third scan signals are supplied to the third scan lines S31 to S3$h$. Each of the third pixels PXL3 that have been supplied with the data signals may control the amount of current flowing to the second pixel power source ELVSS via an organic light-emitting diode.

Furthermore, the number of third pixels PXL3 located on each line (row or column) may be changed depending on the position thereof.

Because the surface area of the third pixel area AA3 is less than that of the first pixel area AA1, the number of third pixels PXL3 may be less than the number of first pixels PXL1. The lengths of third scan lines S31 to S3$h$ and third emission control lines E31 to E3$h$ may be respectively less than that of the first scan lines S11 to S1$k$ and the first emission control lines E11 to E1$k$.

The number of third pixels PXL3 coupled to any one of the third scan lines S31 to S3$h$ may be less than the number of first pixels PXL1 coupled to any one of the first scan lines S1$l$ to S1$k$.

The number of third pixels PXL3 coupled to any one of the third emission control lines E31 to E3$h$ may be less than the number of first pixels PXL1 coupled to any one of the first emission control lines E11 to E1$k$.

The data driver 400 may be operated in response to a data control signal DCS.

The timing controller 270 may control the first scan driver 210, the second scan driver 220, the third scan driver 230, the data driver 400, the first emission driver 310, the second emission driver 320, and the third emission driver 330.

For this operation, the timing controller 270 may supply the first scan control signal SCS1, the second scan control signal SCS2, and the third scan control signal SCS3 to the first scan driver 210, the second scan driver 220, and the third scan driver 230, respectively. In addition, the timing controller 270 may supply the first emission control signal ECS1, the second emission control signal ECS2, and the third emission control signal ECS3 to the first emission driver 310, the second emission driver 320, and the third emission driver 330, respectively.

Here, each of the scan control signals SCS1, SCS2, and SCS3 and the emission control signals ECS1, ECS2, and ECS3 may include at least one clock signal and a start pulse.

The start pulse may control a timing of a $1^{st}$ scan signal or a $1^{st}$ emission control signal. The clock signal may be used to shift the start pulse.

The timing controller 270 may supply the data control signal DCS to the data driver 400.

The data control signal DCS may include a source start pulse and at least one clock signal. The source start pulse may control a sampling start time of data, and the clock signal may be used to control a sampling operation.

Figure 4:
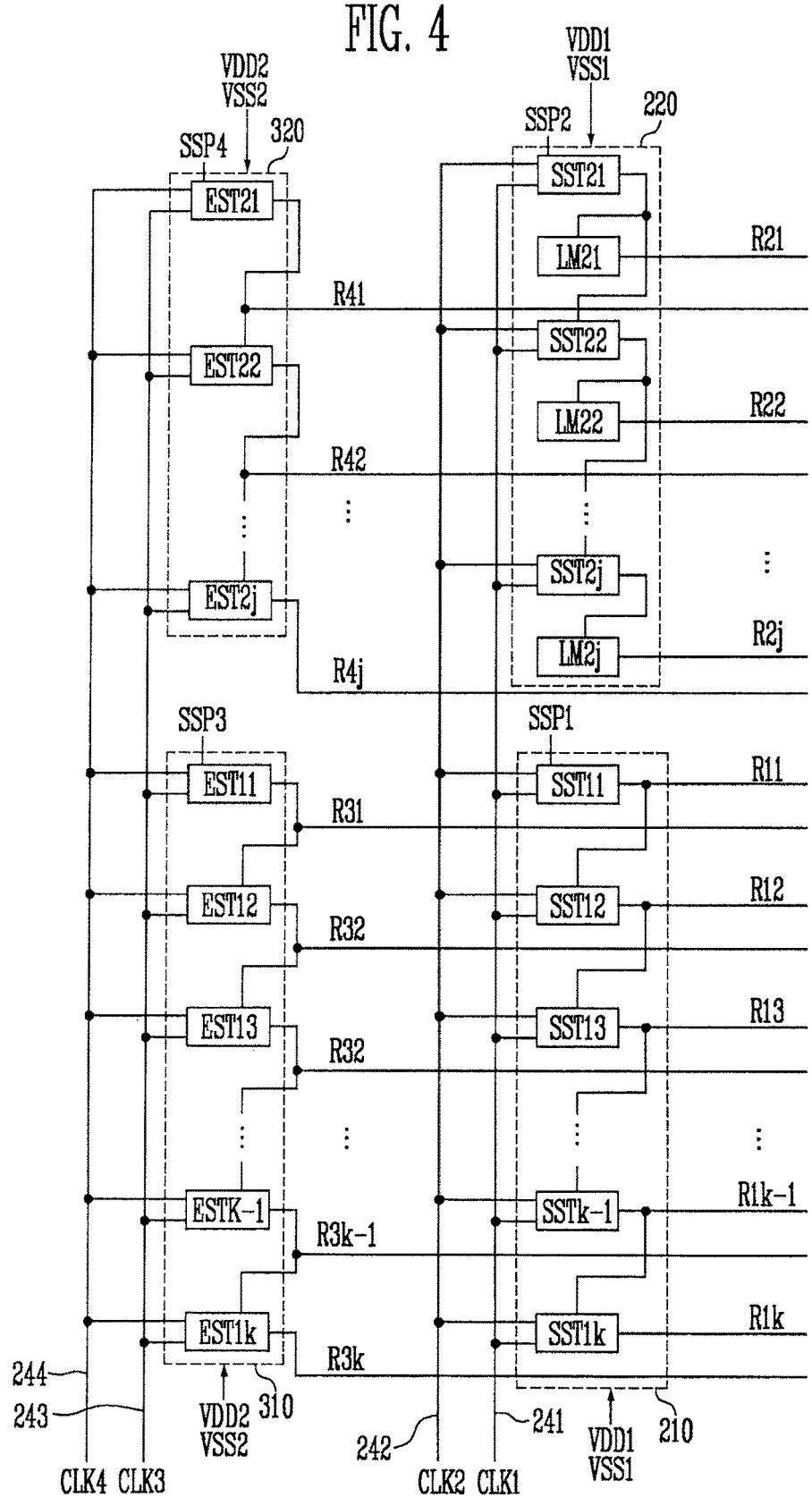
FIGS. 4 and 5 are diagrams illustrating in detail scan drivers and emission drivers shown in FIG. 3.
Figure 5:
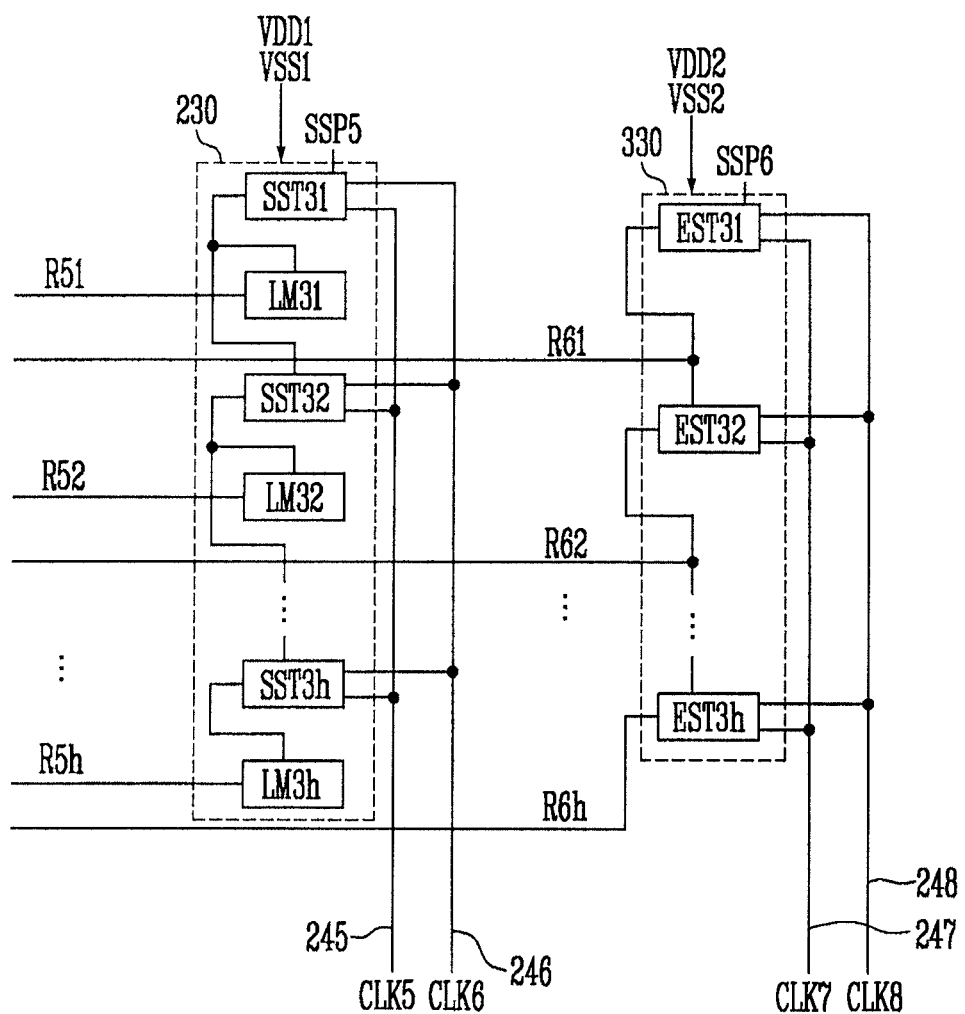

FIGS. 4 and 5 are diagrams illustrating in detail the scan drivers and the emission drivers shown in FIG. 3. For example, FIG. 4 illustrates the first scan driver 210, the second scan driver 220, the first emission driver 310, and the second emission driver 320. FIG. 5 illustrates the third scan driver 230 and the third emission driver 330.

Referring to FIG. 4, the first scan driver 210 may include a plurality of first scan stage circuits SST11 to SST1$k$.

Each of the first scan stage circuits SST11 to SST1$k$ may be coupled to an end of the corresponding one of the first scan routing lines R11 to R1$k$ so that the first scan signal may be supplied to the corresponding one of the first scan lines S11 to S1$k$.

Here, the first scan stage circuits SST11 to SST1$k$ may be operated in response to clock signals CLK1 and CLK2 supplied from the timing controller 270. The first scan stage circuits SST11 to SST1$k$ may be formed of the same circuit.

Each of the first scan stage circuits SST11 to SST1k may be supplied with an output signal (e.g., a scan signal) of a preceding scan stage circuit, or with a start pulse SSP1.

For example, the 1$^{st}$ first-scan stage circuit SST11 may be supplied with the start pulse SSP1, and each of the other first scan stage circuits SST12 to SST1k may be supplied with an output signal of a preceding scan stage circuit.

In another embodiment, the 1$^{st}$ first-scan stage circuit SST11 of the first scan driver 210 may use, as a start pulse, a signal outputted from a last scan stage circuit SST2j of the second scan driver 220.

Each of the first scan stage circuits SST11 to SST1k may be supplied with a first driving power source VDD1 and a second driving power source VSS1.

Here, the first driving power source VDD1 may be set to a gate-off voltage, e.g., a high-level voltage. The second driving power source VSS1 may be set to a gate-on voltage, e.g., a low-level voltage.

The second scan driver 220 may include second scan stage circuits SST21 to SST2j and a plurality of first load matching units LM21 to LM2j.

Each of the second scan stage circuits SST21 to SST2j may be coupled to an end of the corresponding one of the first load matching units LM21 to LM2j. Each of the first load matching units LM21 to LM2j may be coupled to an end of the corresponding one of the second scan routing lines R21 to R2j so that the second scan signal may be supplied to the corresponding one of the second scan lines S2l to S1j.

Each of the first load matching units LM21 to LM2j may delay, by a given value, the second scan signal outputted from the corresponding one of the second scan stage circuits SST21 to SST2j.

Each of the first load matching units LM21 to LM2j may be a circuit formed of a resistor and a capacitor, and may be configured to delay an output signal of the corresponding one of the second scan stage circuits SST21 to SST2j by a time constant (RC delay) of the circuit.

For example, the 1$^{st}$ first load matching unit LM21 may delay a signal outputted from the 1$^{st}$ second scan stage circuit SST21, and may supply the delayed signal to the 1$^{st}$ second scan routing line R21.

For this operation, an input terminal of each of the first load matching units LM21 to LM2j may be electrically coupled with an output terminal of the corresponding one of the second scan stage circuits SST21 to SST2j. An output terminal of each of the first load matching units LM21 to LM2j may be coupled with an end of the corresponding one of the second scan routing lines R21 to R2j.

Each of the first load matching units LM21 to LM2j may be located between corresponding adjacent ones of the second scan stage circuits SST21 to SST2j.

Here, the second scan stage circuits SST21 to SST2j may be operated in response to clock signals CLK1 and CLK2 supplied from the timing controller 270. Each of the second scan stage circuits SST21 to SST2j may be formed of the same circuit.

Each of the second scan stage circuits SST21 to SST2j may be supplied with an output signal (e.g., a scan signal) of a preceding scan stage circuit, or with a start pulse SSP2.

For example, the 1$^{st}$ second scan stage circuit SST21 may be supplied with the start pulse SSP2, and each of the other second scan stage circuits SST22 to SST2j may be supplied with an output signal of a preceding scan stage circuit.

Furthermore, the last scan stage circuit SST2j of the second scan driver 220 may supply an output signal to the 1$^{st}$ first-scan stage circuit SST11 of the first scan driver 210.

Each of the second scan stage circuits SST21 to SST2j may be supplied with the first driving power source VDD1 and the second driving power source VSS1.

A first clock line 241 and a second clock line 242 may be coupled to the first scan driver 210 and the second scan driver 220.

Furthermore, the first clock line 241 and the second clock line 242 may be coupled with the timing controller 270 so that the first clock signal CLK1 and the second clock signal CLK2 supplied from the timing controller 270 may be transmitted to the first scan driver 210 and the second scan driver 220.

For this operation, the first clock line 241 and the second clock line 242 may be located in the first peripheral area NA1 and the second peripheral area NA2.

The first clock signal CLK1 and the second clock signal CLK2 may have different phases. For example, the second clock signal CLK2 may have a phase difference of 180° with respect to the first clock signal CLK1.

In FIG. 4, there is illustrated the case where the first scan driver 210 and the second scan driver 220 share the same clock lines 241 and 242, but the present disclosure is not limited thereto. For example, the first scan driver 210 and the second scan driver 220 may be coupled with respective clock lines separated from each other.

Furthermore, in FIG. 4, there is illustrated the case where each of the scan drivers 210 and 220 uses two clock signals CLK1 and CLK2, but the number of clock signals to be used in each of the scan drivers 210 and 220 may be changed depending on the structure of the scan stage circuit.

The first clock line 241 and the second clock line 242 of the present embodiment are not coupled to the first load matching units LM21 to LM2j.

The first emission driver 310 may include a plurality of first emission stage circuits EST11 to EST1k.

Each of the first emission stage circuits EST11 to EST1k may be coupled to an end of the corresponding one of the first emission routing lines R31 to R3k so that the first emission control signal may be supplied to the corresponding one of the first emission control lines E11 to E1k.

Here, the first emission stage circuits EST11 to EST1k may be operated in response to clock signals CLK3 and CLK4 supplied from the timing controller 270. The first emission stage circuits EST11 to EST1k may be formed of the same circuit.

Each of the first emission stage circuits EST11 to EST1k may be supplied with an output signal (e.g., an emission control signal) of a preceding emission stage circuit, or with a start pulse SSP3.

For example, the 1$^{st}$ first-emission stage circuit EST11 may be supplied with the start pulse SSP3, and each of the other first emission stage circuits EST12 to EST1k may be supplied with an output signal of a preceding emission stage circuit.

In another embodiment, the 1$^{st}$ first-emission stage circuit EST11 of the first emission driver 310 may use, as a start pulse, a signal outputted from a last emission stage circuit EST2j of the second emission driver 320.

Each of the first emission stage circuits EST11 to EST1k may be supplied with a third driving power source VDD2 and a fourth driving power source VSS2.

Here, the third driving power source VDD2 may be set to a gate-off voltage, e.g., a high-level voltage. The fourth driving power source VSS2 may be set to a gate-on voltage, e.g., a low-level voltage.

The third driving power source VDD2 may have the same voltage as that of the first driving power source VDD1. The fourth driving power source VSS2 may have the same voltage as that of the second driving power source VSS1.

The second emission driver 320 may include a plurality of second emission stage circuits EST21 to EST2*j*.

Each of the second emission stage circuits EST21 to EST2*j* may be coupled to an end of the corresponding one of the second emission routing lines R41 to R4*j* so that the second emission control signal may be supplied to the corresponding one of the second emission control lines E21 to E2*j*.

Here, the second emission stage circuits EST21 to EST2*j* may be operated in response to clock signals CLK3 and CLK4 supplied from the timing controller 270. The second emission stage circuits EST21 to EST2*j* may be formed of the same circuit.

Each of the second emission stage circuits EST21 to EST2*j* may be supplied with an output signal (e.g., an emission control signal) of a preceding emission stage circuit, or with a start pulse SSP4.

For example, the $1^{st}$ second emission stage circuit EST21 may be supplied with the start pulse SSP4, and each of the other second emission stage circuits EST22 to EST2*j* may be supplied with an output signal of a preceding emission stage circuit.

Furthermore, in another embodiment, the last emission stage circuit EST2*j* of the second scan driver 320 may supply an output signal to the $1^{st}$ first-emission stage circuit EST11 of the first emission driver 310.

Each of the second emission stage circuits EST21 to EST2*j* may be supplied with the third driving power source VDD2 and the fourth driving power source VSS2.

A third clock line 243 and a fourth clock line 244 may be coupled to the first emission driver 310 and the second emission driver 320.

Furthermore, the third clock line 243 and the fourth clock line 244 may be coupled with the timing controller 270 so that the third clock signal CLK3 and the fourth clock signal CLK4 supplied from the timing controller 270 may be transmitted to the first emission driver 310 and the second emission driver 320.

For this operation, the third clock line 243 and the fourth clock line 244 may be located in the first peripheral area NA1 and the second peripheral area NA2.

The third clock signal CLK3 and the fourth clock signal CLK4 may have different phases. For example, the third clock signal CLK3 may have a phase difference of 180° with respect to the fourth clock signal CLK4.

In FIG. 4, there is illustrated the case where the first emission driver 310 and the second emission driver 320 share the same clock lines 243 and 244, although the present disclosure is not limited thereto. For example, the first emission driver 310 and the second emission driver 320 may be coupled with respective clock lines separated from each other.

Furthermore, in FIG. 4, there is illustrated the case where each of the emission drivers 310 and 320 uses two clock signals CLK3 and CLK4, but the number of clock signals to be used in each of the emission drivers 310 and 320 may be changed in other embodiments depending on the structure of the emission stage circuit.

Referring to FIG. 5, the third scan driver 230 may include a plurality of third scan stage circuits SST31 to SST3*h* and a plurality of second load matching units LM31 to LM3*h*.

Each of the third scan stage circuits SST31 to SST3*h* may be coupled to an end of the corresponding one of the second load matching units LM31 to LM3*j*. Each of the second load matching units LM31 to LM3*h* may be coupled to an end of the corresponding one of the third scan routing lines R51 to R5*h* so that the third scan signal may be supplied to the corresponding one of the third scan lines S31 to S3*h*.

Each of the second load matching units LM31 to LM3*h* may delay, by a given value, the third scan signal outputted from the corresponding one of the third scan stage circuits SST31 to SST3*h*. Each of the second load matching units LM31 to LM3*h* may be a circuit formed of a resistor and a capacitor, and may be configured to delay an output signal of the corresponding one of the third scan stage circuits SST31 to SST3*h* by a time constant of the circuit.

For example, the $1^{st}$ second load matching unit LM31 may delay a signal outputted from the $1^{st}$ third scan stage circuit SST31, and may supply the delayed signal to the $1^{st}$ third scan routing line R51.

For this operation, an input terminal of each of the second load matching units LM31 to LM3*h* may be electrically coupled with an output terminal of the corresponding one of the third scan stage circuits SST31 to SST3*h*. An output terminal of each of the second load matching units LM31 to LM3*h* may be coupled with an end of the corresponding one of the third scan routing lines R51 to R5*h*.

Each of the second load matching units LM31 to LM3*h* may be located between corresponding adjacent ones of the third scan stage circuits SST31 to SST3*h*.

Here, the third scan stage circuits SST31 to SST3*h* may be operated in response to clock signals CLK5 and CLK6 supplied from the timing controller 270. The third scan stage circuits SST31 to SST3*h* may be formed of the same circuit.

Each of the third scan stage circuits SST31 to SST3*h* may be supplied with an output signal (e.g., a scan signal) of a preceding scan stage circuit, or with a start pulse SSP5.

For example, the $1^{st}$ third scan stage circuit SST31 may be supplied with the start pulse SSP5, and each of the other third scan stage circuits SST32 to SST3*h* may be supplied with an output signal of a preceding scan stage circuit.

Each of the third scan stage circuits SST31 to SST3*h* may be supplied with the first driving power source VDD1 and the second driving power source VSS1.

A fifth clock line 245 and a sixth clock line 246 may be coupled to the third scan driver 230.

Furthermore, the fifth clock line 245 and the sixth clock line 246 may be coupled with the timing controller 270 so that the fifth clock signal CLK5 and the sixth clock signal CLK6 supplied from the timing controller 270 may be transmitted to the third scan driver 230.

For this operation, the fifth clock line 245 and the sixth clock line 246 may be located in the first peripheral area NA1 and the third peripheral area NA3.

The fifth clock signal CLK5 and the sixth clock signal CLK6 may have different phases. For example, the sixth clock signal CLK6 may have a phase difference of 180° with respect to the fifth clock signal CLK5.

The fifth clock line 245 and the sixth clock line 246 of the present embodiment are not coupled to the second load matching units LM31 to LM3*h*.

In FIG. 5, there is illustrated the case where the third scan driver 230 uses two clock signals CLK5 and CLK6, but the number of clock signals to be used in the third scan driver 230 may be changed in other embodiments depending on the structure of the scan stage circuit.

The third scan stage circuits SST31 to SST3*h* may have the same circuit structure as that of the first scan stage circuit SST11 to SST1*k* and the second scan stage circuits SST21 to SST2*j*.

The third emission driver 330 may include a plurality of third emission stage circuits EST31 to EST3*h*.

Each of the third emission stage circuits EST31 to EST3*h* may be coupled to an end of the corresponding one of the third emission routing lines R61 to R6*h* so that the third emission control signal may be supplied to the corresponding one of the third emission control lines E31 to E3*h*.

Here, the third emission stage circuits EST31 to EST3*h* may be operated in response to clock signals CLK7 and CLK8 supplied from the timing controller 270. The third emission stage circuits EST31 to EST3*h* may be formed of the same circuit.

Each of the third emission stage circuits EST31 to EST3*h* may be supplied with an output signal (e.g., an emission control signal) of a preceding emission stage circuit, or with a start pulse SSP6.

For example, the $1^{st}$ third emission stage circuit EST31 may be supplied with the start pulse SSP6, and each of the other third emission stage circuits EST32 to EST3*h* may be supplied with an output signal of a preceding emission stage circuit.

Each of the third emission stage circuits EST31 to EST3*h* may be supplied with the third driving power source VDD2 and the fourth driving power source VSS2.

A seventh clock line 247 and an eighth clock line 248 may be coupled to the third emission driver 330.

Furthermore, the seventh clock line 247 and the eighth clock line 248 may be coupled with the timing controller 270 so that the seventh clock signal CLK7 and the eighth clock signal CLK8 supplied from the timing controller 270 may be transmitted to the third emission driver 330.

For this operation, the seventh clock line 247 and the eighth clock line 248 may be located in the first peripheral area NA1 and the third peripheral area NA3.

The seventh clock signal CLK7 and the eighth clock signal CLK8 may have different phases. For example, the eighth clock signal CLK8 may have a phase difference of 180° with respect to the seventh clock signal CLK7.

In FIG. 5, there is illustrated the case where the third emission driver 330 uses two clock signals CLK7 and CLK8, but the number of clock signals to be used in the third emission driver 330 may be changed in other embodiments depending on the structure of the emission stage circuit.

The third emission stage circuits EST31 to EST3*h* may have the same circuit structure as that of the first emission stage circuit EST11 to EST1*k* and the second emission stage circuits EST21 to EST2*j*.

Figure 6:
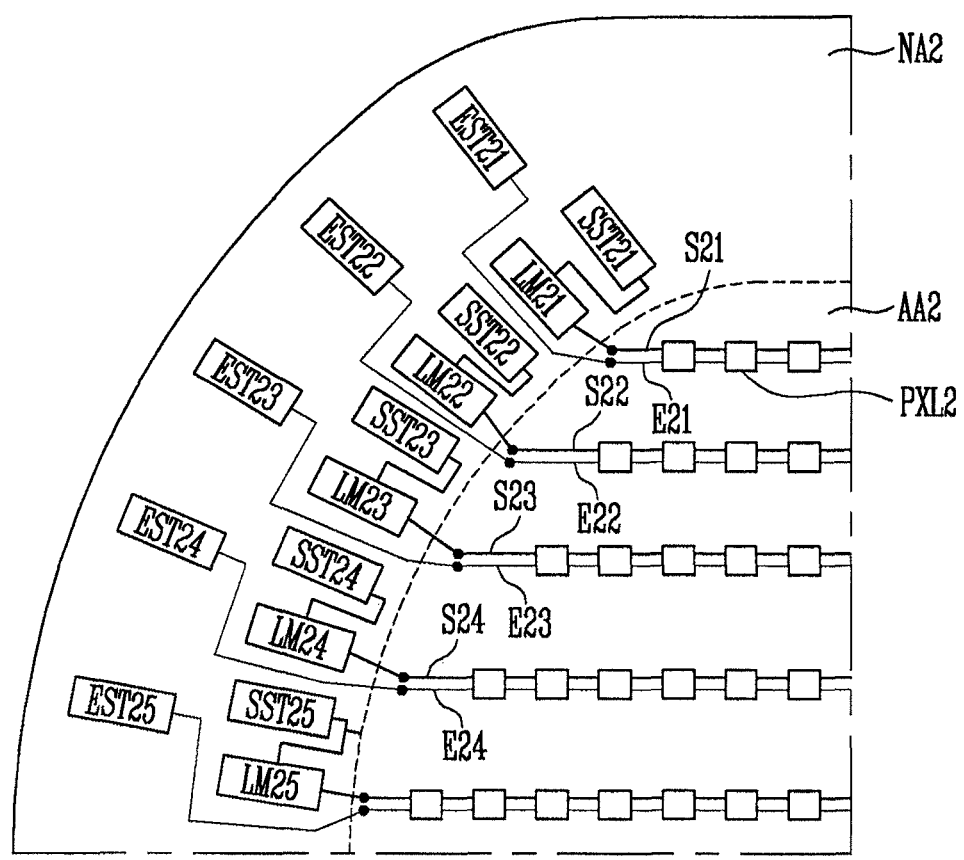
FIG. 6 is a diagram illustrating an arrangement structure of the scan driver and the emission driver in accordance with an embodiment of the present disclosure.

FIG. 6 is a diagram illustrating an arrangement structure of the scan driver and the emission driver in accordance with an embodiment of the present disclosure. For example, in FIG. 6, there is illustrated an example in which the second scan stage circuits SST21 to SST25, the first load matching units LM21 to LM25, and the second emission stage circuits EST21 to EST25 are located in the second peripheral area NA2.

Referring to FIG. 6, a corner of the second peripheral area NA2 may have a curved shape. For example, a region of the second peripheral area NA2 in which the second scan stage circuits SST21 to SST25 and the second emission stage circuits EST21 to EST25 are located may have a bent shape having a curvature, as shown in FIG. 6.

Corresponding to the second peripheral area NA2, a corner of the second pixel area AA2 may also have a curved shape.

To allow the corner of the second pixel area AA2 to have a curved shape, the number of pixels PXL2 located on each pixel row in the second pixel area AA2 may be reduced in a direction away from the first pixel area AA1.

Although the length of each of the pixel rows arranged in the second pixel area AA2 is reduced in the direction away from the first pixel area AA1, there is no need for a length reduction rate to be constant, and the number of pixels PXL2 included in each pixel row may be changed in various manners depending on the curvature of the curved line defining the corner of the second pixel area AA2.

The first peripheral area NA1 may have a linear shape. In this case, the first pixel area AA1 may have a rectangular shape.

Hence, different pixel rows of the first pixel area AA1 may have the same number of pixels PXL1.

Unlike the first peripheral area NA1, the second peripheral area NA2 may have a curved shape. Therefore, to efficiently use the second peripheral area NA2 that is dead space, a suitable arrangement structure of the second scan stage circuits SST21 to SST25 and the second emission stage circuits EST21 to EST25 may differ from that of the first peripheral area NA1.

For example, the distance between the first scan stage circuits may be set to a constant value while the distance between the second scan stage circuits SST21 to SST25 may be set to a value that is greater than the distance between the first scan stage circuits.

In addition, the distance between the second scan stage circuits SST21 to SST25 may be changed depending on the position thereof.

For example, the distance between a pair of adjacent second scan stage circuits SST23 and SST24 may differ from the distance between another pair of adjacent second scan stage circuits SST21 and SST22.

Furthermore, although the first scan stage circuits are oriented almost parallel to the pixel rows, the second scan stage circuits SST21 to SST25 may be oriented to have angles with respect to the pixel rows unlike that of the first scan stage circuits. For example, the angle of each of the second scan stage circuits SST21 to SST25 with respect to the pixel rows may increase in a direction away from the first peripheral area NA1.

Each of the first load matching units LM21 to LM25 may be located between corresponding adjacent ones of the second scan stage circuits SST21 to SST25.

For example, the $1^{st}$ first load matching unit LM21 may be located between the $1^{st}$ second scan stage circuit SST21 and the $2^{nd}$ second scan stage circuit SST22.

The $2^{nd}$ first load matching unit LM22 may be located between the $2^{nd}$ second scan stage circuit SST22 and the $3^{rd}$ second scan stage circuit SST23.

As described above with reference to FIG. 1, the width W1 of the first pixel area AA1 may be greater than the width W2 of the second pixel area AA2. Therefore, in the case where the scan lines S11 to S1*k* and S21 to S2*j* extend in a lateral direction, the first scan lines S11 to S1*k* may be longer than the second scan lines S21 to S2*j*.

In this case, the load value of the first scan lines S11 to S1*k* may be greater than that of the second scan lines S21 to S2*j*. A difference in load value may cause a difference in luminance. For example, there may be a problem in that a horizontal line may be visible on a boundary between the first pixel area AA1 and the second pixel area AA2.

However, the display device 10 in accordance with an embodiment of the present disclosure may include the described load matching units LM21 to LM25 to compensate for the difference in load value, thus solving the above-mentioned problem.

Furthermore, the load matching units LM21 to LM25 may be provided in extra space formed between the second scan stage circuits SST21 to SST25, whereby the space utilization of the second peripheral area NA2 may be improved.

The second emission stage circuits EST21 to EST25 may also be arranged in the same manner as that of the second scan stage circuits SST21 to SST25.

For example, the distance between the first emission stage circuits may be set to a constant value while the distance between the second emission stage circuits EST21 to EST25 may be set to a value greater than the distance between the first emission stage circuits.

In addition, the distance between the second emission stage circuits EST21 to EST25 may be changed depending on the position thereof.

For example, the distance between a pair of adjacent second emission stage circuits EST23 and EST24 may differ from the distance between another pair of adjacent second emission stage circuits EST21 and EST22.

In detail, the distance between the pair of adjacent second emission stage circuits EST21 and EST22 may be greater than the distance between another pair of adjacent second emission stage circuits EST23 and EST24.

Furthermore, although the first emission stage circuits are oriented almost parallel to the pixel rows, the second emission stage circuits EST21 to EST25 may be oriented to have angles with respect to the pixel rows unlike that of the first emission stage circuits. For example, the angle of each of the second emission stage circuits EST21 to EST25 with respect to the pixel rows may increase in a direction away from the first peripheral area NA1.

In other embodiments, dummy emission stage circuits may be provided between the second emission stage circuits EST21 to EST25.

For example, each of the dummy emission stage circuits may be located between corresponding adjacent ones of the second emission stage circuits EST21 to EST25. The number of dummy emission stage circuits located between the adjacent second emission stage circuits may be changed depending on the position thereof.

The dummy emission stage circuits may have the same structure as that of the second emission stage circuits EST21 to EST25, but are not coupled with the clock lines 243 and 244. Thus, an operation of outputting an emission control signal is not performed on the dummy emission stage circuits. The third scan stage circuits SST31 to SST3$h$, the second load matching units LM31 to LM3$h$, and the third emission stage circuits EST31 to EST3$h$ that are located in the third peripheral area NA3 may be bilaterally symmetrical with the second scan stage circuits SST21 to SST2$j$, the first load matching units LM21 to LM2$j$, and the second emission stage circuits EST21 to EST2$j$ that are located in the second peripheral are NA2.

Dummy emission stage circuits may also be provided between the third emission stage circuits EST31 to EST3$h$.

Figure 7:
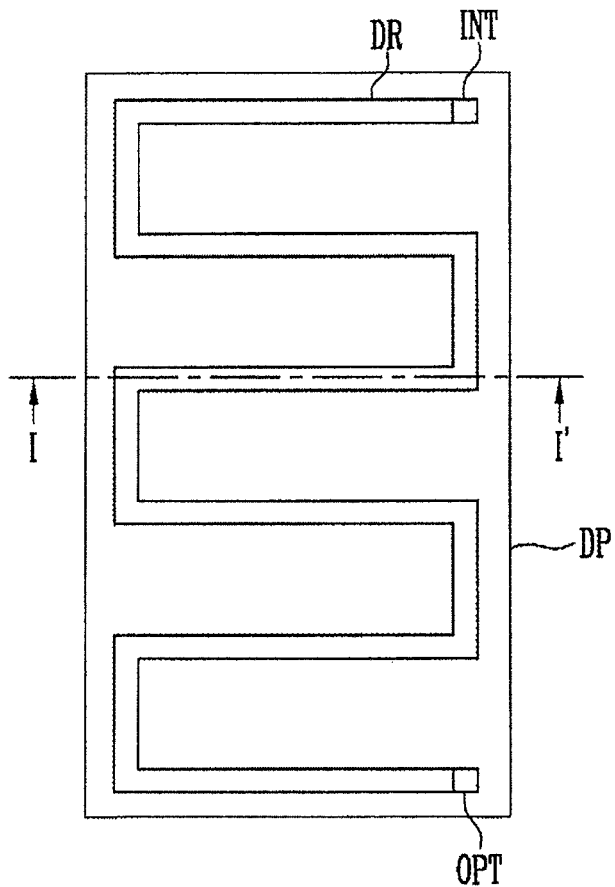
FIG. 7 is a plan view illustrating the configuration of a load matching unit shown in FIGS. 4 and 5.
Figure 8:
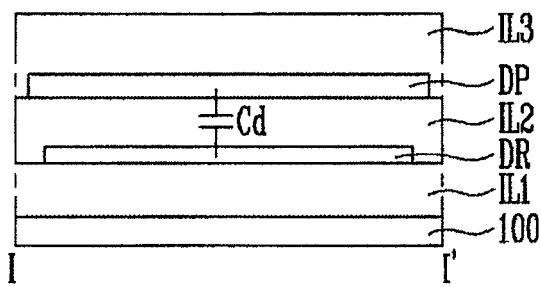
FIG. 8 is a sectional view taken along the line I-I' of FIG. 7.

FIG. 7 is a plan view illustrating the configuration of the load matching unit shown in FIGS. 4 and 5. FIG. 8 is a sectional view taken along the line I-I' of FIG. 7.

Referring to FIGS. 7 and 8, each of the load matching units LM21 to LM2$j$ and LM31 to LM3$h$ may include a first delay pattern DR and a second delay pattern DP.

The first delay pattern DR may be located on a first insulating layer IL1. At least a portion of the first delay pattern DR may have a bent shape. The first delay pattern DR may be located on the same layer as that of the scan lines S21 to S2$j$ and S31 to S3$h$.

The first delay pattern DR may function as delay resistance of the corresponding one of the load matching units LM21 to LM2$j$, and LM31 to LM3$h$.

The first delay pattern DR may include an input terminal INT and an output terminal OPT. The input terminal INT may be coupled to the output terminal of the corresponding one of the scan stage circuits SST21 to SST2$j$ and SST31 to SST3$h$. The output terminal OPT may be electrically coupled to the corresponding one of the scan lines S21 to S2$j$ and S31 to S3$h$ through the corresponding one of the scan routing lines R21 to R2$j$ and R51 to R5$h$.

The second delay pattern DP may be located on a layer different from that of the first delay pattern DR, and may have a rectangular plate shape. For example, a second insulating layer IL2 may be located on the first delay pattern DR, and the second delay pattern DP may be located on the second insulating layer IL2.

The first delay pattern DR and the second delay pattern DP may overlap each other on different layers. Consequently, the first delay pattern DR and the second delay pattern DP may form a delay capacitor Cd.

To allow the first delay pattern DR and the second delay pattern DP to form the delay capacitor Cd, the first driving power source VDD1 or the second driving power surface VSS1 may be supplied to the second delay pattern DP.

The second delay pattern DP may be a portion of a power line provided for supply of the first driving power source VDD1. Alternatively, the second delay pattern DP may be electrically coupled, by a given line, to the power line provided for supply of the first driving power source VDD1.

As a further alternative, the second delay pattern DP may be a portion of a power line provided for supply of the second driving power source VSS1. As a further alternative, the second delay pattern DP may be electrically coupled, by a given line, to the power line provided for supply of the second driving power source VSS1.

Each of the load matching units LM21 to LM2$j$ and LM31 to LM3$h$ may delay an output signal of the corresponding one of the scan stage circuits SST21 to SST2$j$ and SST31 to SST3$h$ by an RC delay value due to the delay resistance and the delay capacitor Cd.

The length of each of the pixel rows arranged in the second pixel area AA2 may be reduced in the direction away from the first pixel area AA1. Furthermore, the length of each of the pixel rows arranged in the third pixel area AA3 may be reduced in the direction away from the first pixel area AA1.

In other words, the length of the 1$^{st}$ second scan line S21 may be less than that of the last second scan line S2$j$. In this case, the RC delay value of the 1$^{st}$ first load matching unit LM21 may be set as a value that is greater than the RC delay value of the last first load matching unit LM2$j$.

Furthermore, the length of the 1$^{st}$ third scan line S31 may be less than that of the last third scan line S3$h$. In this case, the RC delay value of the 1$^{st}$ second load matching unit LM31 may be set as a value that is greater than the RC delay value of the last second load matching unit LM3$h$.

In other words, the load matching units may be set such that, as the distance between each load matching unit and the first pixel area AA1 or the first peripheral area NA1 is increased, the RC delay value is increased.

The RC delay value of each of the load matching units LM21 to LM2$j$ and LM31 to LM3$h$ may be adjusted by controlling the delay resistance and the value of the delay capacitor Cd.

For example, the delay resistance of each of the load matching units LM21 to LM2$j$ and LM31 to LM3$h$ may be adjusted by changing the length or thickness of the first delay pattern DR.

Furthermore, the capacitance value of the delay capacitor Cd may be adjusted by changing the surface area with which the first delay pattern DR and the second delay pattern DP overlap each other.

Figure 9:
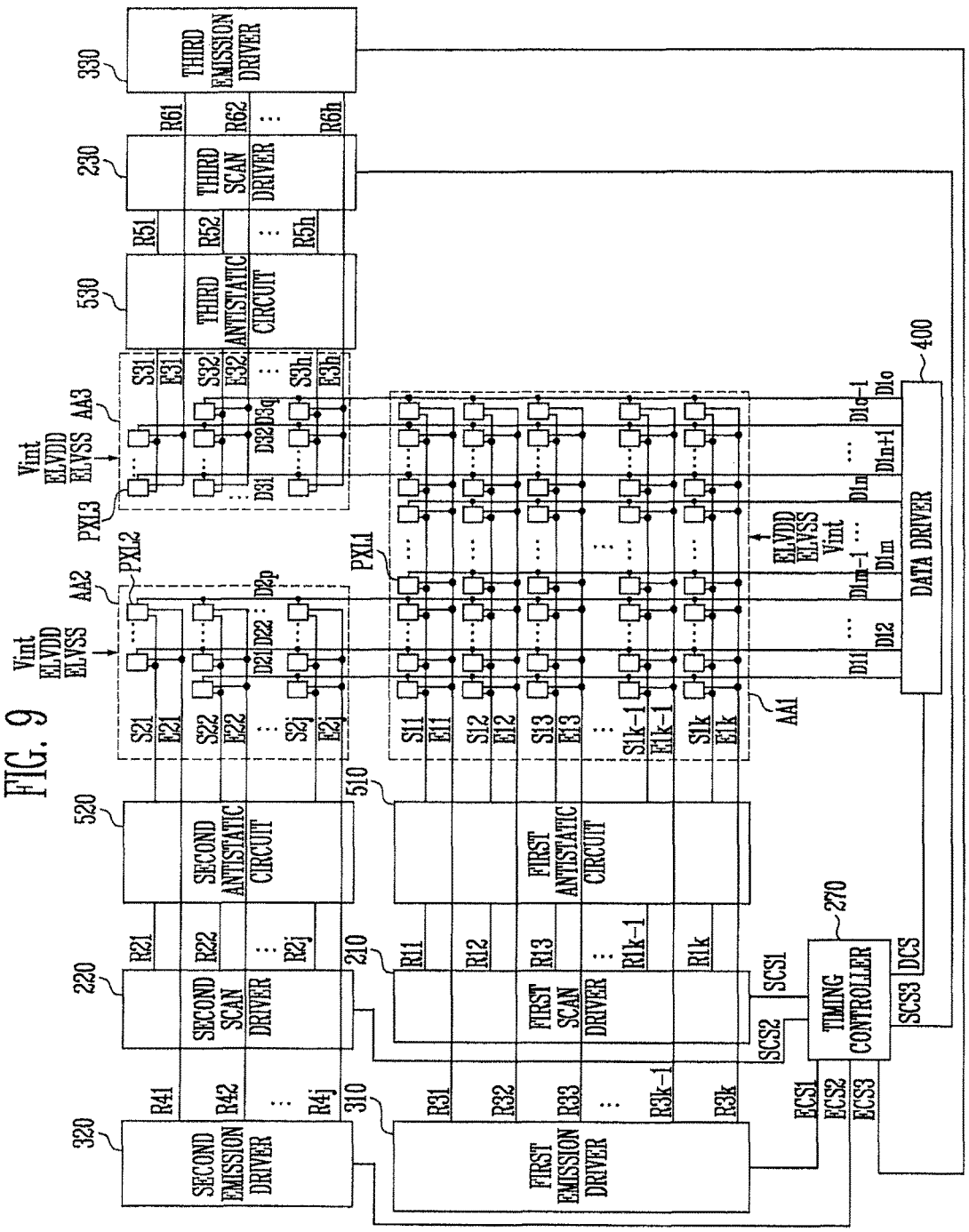
FIG. 9 is a diagram illustrating an embodiment of the display device shown in FIG. 2.

FIG. 9 is a diagram illustrating an embodiment of the display device shown in FIG. 2.

The description of FIG. 9 will be focused on differences from the above-stated embodiments (e.g., the embodiment of FIG. 3), and some descriptions will be omitted if deemed redundant. Here, the following description will center on antistatic circuits 510, 520, and 530.

Referring to FIG. 9, the display device in accordance with an embodiment of the present disclosure may further include the antistatic circuits 510, 520, and 530.

The first antistatic circuit 510 may be located between the first scan driver 210 and the first pixels PXL1 and coupled with the first scan lines S11 to S1k.

When a high voltage (e.g., static electricity) is instantaneously applied to the lines provided in the display device, the first antistatic circuit 510 may function to disperse the applied high voltage to the entirety of first scan lines S11 to S1k.

The second antistatic circuit 520 may be located between the second scan driver 220 and the second pixels PXL2 and coupled with the second scan lines S21 to S2j.

When a high voltage (e.g., static electricity) is instantaneously applied to the lines provided in the display device, the second antistatic circuit 520 may function to disperse the applied high voltage to the entirety of second scan lines S21 to S2j.

The second antistatic circuit 520 may be formed of the same circuit as that of the first antistatic circuit 510.

The third antistatic circuit 530 may be located between the third scan driver 230 and the third pixels PXL3 and coupled with the third scan lines S31 to S3h.

When a high voltage (e.g., static electricity) is instantaneously applied to the lines provided in the display device, the third antistatic circuit 530 may function to disperse the applied high voltage to the entirety of third scan lines S31 to S3h.

The third antistatic circuit 530 may be formed of the same circuit as that of the first antistatic circuit 510.

Figure 10:
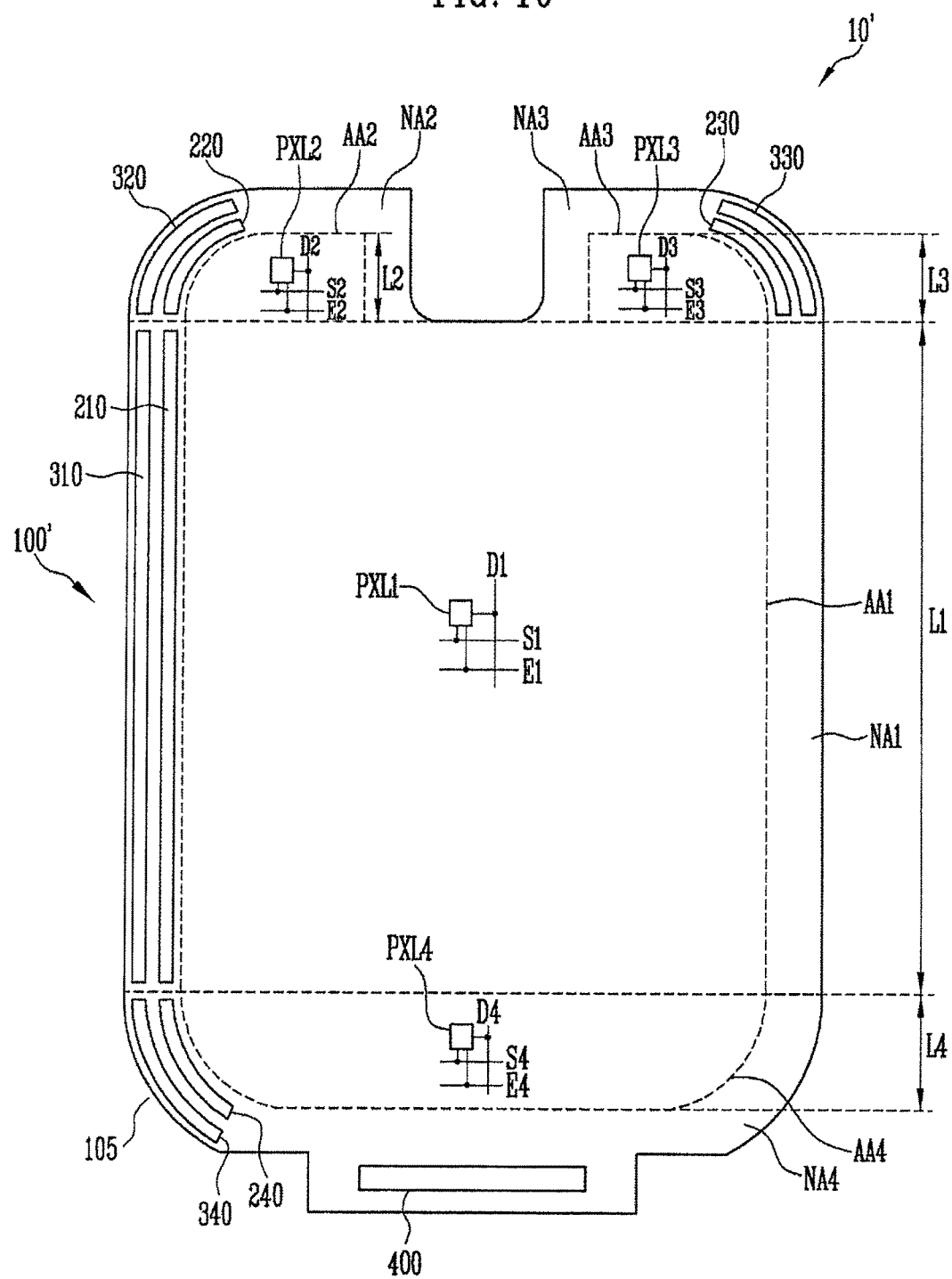
FIG. 10 is a diagram illustrating a display device in accordance with an embodiment of the present disclosure.

FIG. 10 is a diagram illustrating a display device 10' in accordance with an embodiment of the present disclosure.

The description of FIG. 10 will be focused on differences from the above-stated embodiments (e.g., the embodiment of FIG. 2), and some descriptions will be omitted if deemed redundant. The following description will be centered on a fourth pixel area AA4 and a fourth peripheral area NA4.

Referring to FIG. 10, the display device 10' in accordance with an embodiment of the present disclosure may include pixel areas AA1, AA2, AA3, and AA4, peripheral areas NA1, NA2, NA3, and NA4 and pixels PXL1, PXL2, PXL3, and PXL4.

The fourth pixel area AA4 may be located on one side of the first pixel area AA1, and may be spaced apart from the second pixel area AA2 and the third pixel area AA3 with the first pixel area AA1 located therebetween.

The fourth pixel area AA4 may have a surface area that is less than that of the first pixel area AA1. For example, a length L4 of the fourth pixel area AA4 may be less than the length L1 of the first pixel area AA1.

The fourth peripheral area NA4 may be located outside the fourth pixel area AA4, and may have a shape to enclose at least a portion of the fourth pixel area AA4.

The fourth peripheral area NA4 and the first peripheral area NA1 may be coupled to each other or not, depending on the shape of a substrate 100'.

The peripheral areas NA1, NA2, NA3, and NA4 may generally have the same width. However, the present disclosure is not limited to this. For example, the width of each of the peripheral areas NA1, NA2, NA3, and NA4 may be changed depending on the position thereof.

The pixels PXL1, PXL2, PXL3, and PXL4 may include first pixels PXL1, second pixels PXL2, third pixels PXL3, and fourth pixels PXL4.

For example, the first pixels PXL1 may be located in the first pixel area AA1. The second pixels PXL2 may be located in the second pixel area AA2. The third pixels PXL3 may be located in the third pixel area AA3. The fourth pixels PXL4 may be located in the fourth pixel area AA4.

The fourth pixels PXL4 may emit light having a corresponding luminance under control of a fourth scan driver 240 and a fourth emission driver 340, which are located in the fourth peripheral area NA4. For this operation, each fourth pixel PXL4 may include a light-emitting element (e.g., an organic light-emitting diode).

The substrate 100' may be formed in various shapes so long as the pixel areas AA1, AA2, AA3, and AA4 and the peripheral areas NA1, NA2, NA3, and NA4 can be defined on the substrate 100'.

For instance, the substrate 100' may include a planar base substrate 101, a first auxiliary plate 102 and a second auxiliary plate 103 that protrude in a direction from a first end of the base substrate 101, and a fourth auxiliary plate 105 extending from a second end of the base substrate 101.

A corner of the fourth auxiliary plate 105 may have an inclined shape or a curved shape. In response to this, at least a portion of the fourth pixel area AA4 may have a curved shape. For example, a corner of the fourth pixel area AA4 may have a curved shape with a curvature.

In this case, the fourth peripheral area NA4 may have on at least a portion thereof a curved shape corresponding to the fourth pixel area AA4.

In response to a change in shape of the fourth pixel area AA4, the number of fourth pixels PXL4 located on each line (row or column) may be changed depending on the position thereof. For example, the number of fourth pixels PXL4 located on each line may be reduced in a direction away from the first pixel area AA1.

The fourth scan driver 240 may include the same load matching units as those provided in the second scan driver 220 or the third scan driver 230.

Each of the load matching units provided in the fourth scan driver 240 may be located between corresponding adjacent ones of the fourth scan stage circuits. Here, the load matching units may be set such that, as the distance between each load matching unit and the first pixel area AA1 is increased, the RC delay value is increased.

Various embodiments of the present disclosure may provide a display device capable of displaying an image having uniform luminance.

Various embodiments of the present disclosure may provide a display device having a structure capable of efficiently using dead space.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included.

What is claimed is:

1. A display device comprising:
    first pixels in a first pixel area and coupled with first scan lines;
    first scan stage circuits in a first peripheral area outside the first pixel area, and configured to supply a first scan signal to the first scan lines;
    second pixels in a second pixel area having a width that is less than a width of the first pixel area, and coupled with second scan lines;
    second scan stage circuits in a second peripheral area outside the second pixel area, and configured to generate a second scan signal; and
    first load matching units respectively between the second scan stage circuits, and configured to delay the second scan signal, and to supply the delayed second scan signal to the second scan lines.

2. The display device according to claim 1, wherein at least a corner of the second pixel area has a curved shape.

3. The display device according to claim 1, wherein a number of respective ones of the second pixels on each horizontal line is reduced in a direction away from the first pixel area.

4. The display device according to claim 1, wherein each of the first load matching units comprises:
    a first delay pattern; and
    a second delay pattern on a layer that is different from a layer on which the first delay pattern is located, with an insulating layer provided therebetween.

5. The display device according to claim 4, wherein the first delay pattern comprises:
    an input terminal coupled to an output terminal of a corresponding one of the second scan stage circuits; and
    an output terminal electrically coupled to a corresponding one of the second scan lines.

6. The display device according to claim 4, wherein the first delay pattern and the second delay pattern form a delay capacitor.

7. The display device according to claim 6, wherein the first load matching units delay the second scan signal by a time constant corresponding to the first delay pattern and the second delay pattern.

8. The display device according to claim 7, wherein the time constant is increased as a distance between the first peripheral area and a corresponding one of the first load matching units is increased.

9. The display device according to claim 1, wherein a distance between the second scan stage circuits is greater than a distance between the first scan stage circuits.

10. The display device according to claim 1, further comprising:
    third pixels in a third pixel area spaced apart from the second pixel area, and coupled with third scan lines;
    third scan stage circuits in a third peripheral area provided outside the third pixel area, and configured to generate a third scan signal; and
    second load matching units respectively between the third scan stage circuits, and configured to delay the third scan signal, and to supply the delayed third scan signal to the third scan lines.

11. The display device according to claim 10, wherein the third pixel area has a width that is less than the width of the first pixel area, and
    wherein a number of respective ones of the third pixels on each horizontal line is reduced in a direction away from the first pixel area.

12. The display device according to claim 10, wherein a distance between the third scan stage circuits is greater than a distance between the first scan stage circuits.

13. The display device according to claim 10, wherein each of the second load matching units comprises:
    a first delay pattern; and
    a second delay pattern on a layer that is different from a layer on which the first delay pattern is located, the second delay pattern being configured to form a capacitance with the first delay pattern.

14. The display device according to claim 13, wherein the second load matching units delay the third scan signal by a time constant corresponding to the first delay pattern and the second delay pattern.

15. The display device according to claim 14, wherein the time constant is increased as a distance between the first peripheral area and a corresponding one of the second load matching units is increased.

16. The display device according to claim 1, further comprising:
    a first antistatic circuit coupled with the first scan lines; and
    a second antistatic circuit coupled with the second scan lines.

* * * * *